(12) United States Patent
Kanai

(10) Patent No.: US 8,078,994 B2
(45) Date of Patent: Dec. 13, 2011

(54) METHOD OF DESIGNING SEMICONDUCTOR DEVICE INCLUDING DENSITY VERIFICATION

(75) Inventor: Dai Kanai, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 170 days.

(21) Appl. No.: 12/556,302

(22) Filed: Sep. 9, 2009

(65) Prior Publication Data

US 2010/0031208 A1 Feb. 4, 2010

Related U.S. Application Data

(63) Continuation of application No. PCT/JP2007/055558, filed on Mar. 19, 2007.

(51) Int. Cl.
*G06F 17/50* (2006.01)

(52) U.S. Cl. ............ 716/52; 716/111; 716/136

(58) Field of Classification Search .......... None
See application file for complete search history.

(56) References Cited

U.S. PATENT DOCUMENTS

| | | | | |
|---|---|---|---|---|
| 6,505,325 | B1* | 1/2003 | Hamamoto | 716/52 |
| 7,093,212 | B2* | 8/2006 | DeCamp et al. | 716/112 |
| 7,269,807 | B2* | 9/2007 | Shimada et al. | 716/52 |
| 7,343,580 | B2* | 3/2008 | Zorrilla et al. | 716/52 |
| 2005/0204327 | A1* | 9/2005 | Mukai et al. | 716/19 |

FOREIGN PATENT DOCUMENTS

| | | |
|---|---|---|
| JP | 6-125007 | 5/1994 |
| JP | 2001-60212 | 3/2001 |
| JP | 2003-67441 | 3/2003 |
| JP | 2005-222214 | 8/2005 |

OTHER PUBLICATIONS

International Search Report for PCT/JP2007/055558, mailed Apr. 17, 2007.

* cited by examiner

*Primary Examiner* — Leigh Garbowski
(74) *Attorney, Agent, or Firm* — Staas & Halsey LLP

(57) ABSTRACT

A method of designing a semiconductor device includes density verification of layout data of the semiconductor device at a macro level. The method includes disposing virtual patterns each including a predetermined step width on a circumference of a verification frame; and moving the verification frame outside which the virtual patterns are disposed sequentially by the predetermined step width and performing the density verification of the layout data of the semiconductor device.

16 Claims, 10 Drawing Sheets

METHOD OF DESIGNING SEMICONDUCTOR DEVICE INCLUDING DENSITY VERIFICATION

CROSS-REFERENCE TO RELATED APPLICATION

This application is a continuation application and is based upon PCT/JP2007/055558, filed on Mar. 19, 2007, and which is incorporated herein by reference in its entirety.

FIELD

The embodiments disclosed herein are related to a method of designing a semiconductor device.

BACKGROUND

In recent years, as semiconductor devices (LSIs: large scale integrated circuits) are becoming multi-layered, trace smoothness is studied due to processing constraints in CMP (chemical mechanical polishing) process and the like. Therefore, for example, in physical verification, density verification (a chip region is divided by a verification frame and the verification frame is moved stepwise by a predetermined width) was performed for verifying whether trace density is within a specific standard value or not. Then, if the trace density exceeds the specific standard value, trace layout is corrected.

In the conventional layout data verification method (design method) for the semiconductor device, even if the layout data passes the density verification with no error at a macro level, in chip-level density verification where the macro is loaded, a density error (density exceeding a standard value) may occur due to difference of starting origins (difference of how patterns are included in the density verification frame).

In this case, the macro is corrected for each product type so as to pass the density verification and, therefore, a man-hour is used every time the macro is corrected. Further, in such approach, when the same macro is loaded on another product type, the error may occur again and, therefore, this approach does not solve the problem.

In this connection, conventionally, in order to reduce the data amount to be checked and, thus, processing time for verifying layout data of a semiconductor device, there is proposed a layout data verification method of a semiconductor device, comprising the steps of: setting a graphic data extraction region including a width of a design standard value from an outside frame of a functional block; preparing extracted data by extracting pattern data at least a portion of which is included in the graphic data extraction region; preparing extracted data from other functional blocks in a similar manner; setting a trace data extraction region including a width of the design standard value from a boundary line of a trace block; preparing extracted trace data by extracting pattern data at least a portion of which is included in the trace data extraction region; and, then, performing design rule check on the whole semiconductor device based on all extracted data and trace extracted data (Japanese Laid-Open Patent Publication No. H06-125007).

As described above, as the LSIs are becoming multi-layered and the trace smoothness is studied from the process viewpoint such as the CMP process, there arises a need to ensure that trace density does not exceed a standard value (for example, 40% to 60%).

Then, in the conventional layout data verification method (design method) for the semiconductor device, the density verification (for example, density verification by dividing a chip region by a verification frame of a square shape of 100 µm×100 µm, and moving the verification frame sequentially by a predetermined step width such as 10 µm) is performed in a physical verification phase (DRC: design rule check).

FIGS. 1 to 4 are diagrams for describing problems in the conventional layout data verification method of the semiconductor device. In FIGS. 1 to 4, reference symbol 100 denotes a chip, 200 denotes a macro (macro A), O1 denotes an origin of the chip, O2 denotes an origin of the macro, and W denotes a density verification frame.

As illustrated in FIG. 1, for example, density verification of chip (semiconductor device: LSI) 100 is performed with reference to origin O1 of chip 100 by shifting (moving) density verification frame (for example, verification frame of a square shape of 100 µm×100 µm) W sequentially from this origin O1 by a predetermined step width (for example, 10 µm). Here, the density verification is typically performed on patterns in a region included in density verification frame W by shifting this density verification frame W by the predetermined step width from the lower left origin (O1) in the right or upper direction.

On the other hand, as illustrated in FIG. 2, density verification of macro (macro A) 200 (macro-level density verification) is typically performed with reference to origin O2 of macro 200 by shifting density verification frame W sequentially from this origin O2 by a predetermined step width.

However, when macro 200 is disposed on chip 100, macro 200 is disposed on an arbitrary position on chip 100 and, therefore, the density verification of chip 100 (chip-level density verification) is performed with reference to origin O1 of chip 100 that differs from origin O2 of macro 200.

As a result, for example, as illustrated in FIG. 3 (FIG. 3 illustrates a case where origin O2 of macro 200 and origin O1 of chip 100 differ in the X-axis (horizontal) direction), in spite of the fact that the layout data passes the density verification at the macro level (200) with no error (OK) in N-1 and N steps, when the density verification is performed at the chip level (100) where the macro is loaded in X step, a density error (a pseudo error due to density exceeding a maximum density) occurs due to difference of how patterns are included in the density verification frame W resulting from difference of the starting origins.

More specifically, in the example of FIG. 3, in the circumference (the left and right ends) of density verification frame W, even though a metal pattern (metal trace) M101 is included in density verification frame W in macro-level N-1 step and a metal pattern M102 is included in density verification frame W in macro-level N step so that the density verification is OK (for example, trace density is less than or equal to a maximum density 60%), for example, in chip-level X step, both metal patterns M101 and M102 may be included in density verification frame W so as to cause an error in the density verification. (For example, the trace density exceeds the maximum density 60%.) It is because the macro is typically prepared just below the upper limit of the density standard.

Then, in the conventional art, if the density error occurs in the chip-level density verification as described above, the process returns the macro level (returns to macro correction) to correct the macro for each product type so as to pass the chip-level density verification and, therefore, a man-hour is used every time the macro is corrected. Further, in such approach, when the same macro is loaded on another product type, the error may occur again and, therefore, this approach does not solve the problem.

In order to address this problem, as a technique for satisfying the density verification standard without returning to the macro correction, it is considered to make the step width smaller (finer) in the macro-level density verification. FIG. 4 illustrates an example in which the step width is changed from 10 μm in the above example to 1.0 μm.

As illustrated in FIG. 4, for example, in the macro-level density verification, when the step width is 1.0 μm, it is seen that, even in the region where no error is detected in (N-1 and N steps), an error is detected in (N' step).

However, in the macro-level density verification, in order to satisfy the density verification standard by simply reducing the step width, the step width is reduced up to a minimum grid (for example, 5 nm) in a design rule used for manufacturing the semiconductor device, but, such fine step width is practically impossible because of enormous time for the density verification.

Thus, properly speaking, at the macro level, the density verification may be satisfied from an infinite number of starting origins (or, in other words, with the verification frame disposed at an arbitrary position), but such verification may not be implemented due to constraints of TAT (turn around time) and tools and, in reality, the verification is performed from only one origin. Therefore, the density standard may not be satisfied in the verification frame at some of arbitrary starting points existing between adjacent steps and, as a result, there are regions where the verification is insufficient. Further, it is not practical to make the step width smaller because it directly increases time for the density verification.

Therefore, in the conventional layout data verification method (program) for the semiconductor device, when the macro is prepared just below the upper limit of density, there is a possibility to cause the density error at the macro level in the verification from starting origins other than one specific starting origin.

SUMMARY

According to an aspect of the embodiments, there is provided a method of designing a semiconductor device including density verification of layout data of the semiconductor device at a macro level.

The method includes disposing virtual patterns each including a predetermined step width on a circumference of a verification frame; and moving the verification frame outside which the virtual patterns are disposed sequentially by the predetermined step width and performing the density verification of the layout data of the semiconductor device.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Below, preferred embodiments of a method of designing a semiconductor device will be described in detail with reference to accompanying drawings.

Figure 5:
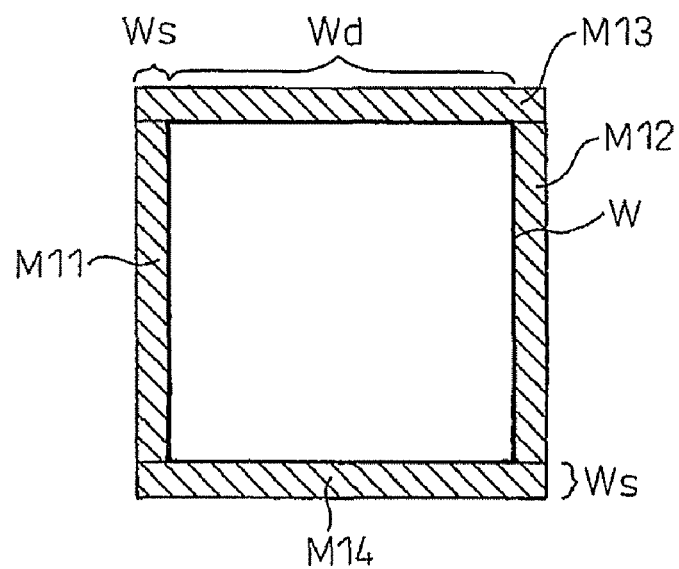
FIG. 5 is a diagram for schematically describing one embodiment of a method of designing a semiconductor device.

FIG. 5 is a diagram for schematically describing one embodiment of a method of designing a semiconductor device. In FIG. 5, reference symbol W denotes a verification frame, Wd denotes a width of the verification frame, Ws denotes a step width, and M11 to M14 denote virtual metal patterns.

As illustrated in FIG. 5, in the method of designing the semiconductor device of this embodiment, it is assumed that verification frame W includes a square shape and virtual metal patterns M11 to M14 each including step width Ws are disposed outside respective (four) sides of this verification frame W of square shape.

Here, assuming that a total area of virtual metal patterns M11 to M14 is S1 and an area of the metal patterns extracted in verification frame W is S0, a density Dm1 of the metal patterns is expressed as:

$$Dm1 = (S0 + S1)/(Wd + 2Ws)^2$$

Thus, in the embodiment illustrated in FIG. 5, during macro-level verification, virtual metal patterns M11 to M14 each including step width Ws are disposed outside the circumference (or the four sides) of density verification frame W and, assuming that metal patterns M11 to M14 exist, the density verification is performed.

Figure 6:
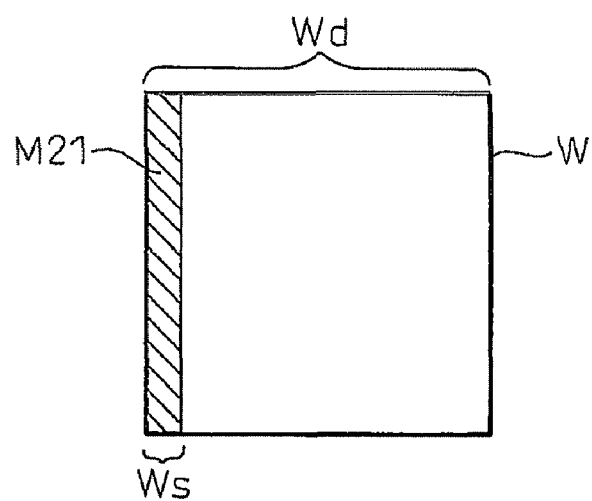
FIG. 6 is a diagram for schematically describing another embodiment of a method of designing a semiconductor device.

FIG. 6 is a diagram for schematically describing another embodiment of a method of designing a semiconductor device.

As illustrated in FIG. 6, in the method of designing the semiconductor device of this embodiment, it is assumed that verification frame W includes a square shape and a virtual metal pattern M21 including step width Ws is disposed inside of one side of this verification frame W of square shape.

Here, assuming that an area of virtual metal pattern M21 is S2 and an area of the metal pattern extracted in verification frame W is S0, a density Dm2 of the metal pattern is expressed as:

$$Dm2 = (S0 + S2)/Wd^2$$

Thus, in the embodiment illustrated in FIG. 6, during macro-level verification, virtual metal pattern M21 including step width Ws is disposed inside one side of density verification frame W and, assuming that metal pattern M21 exists, the density verification is performed.

Figure 7:
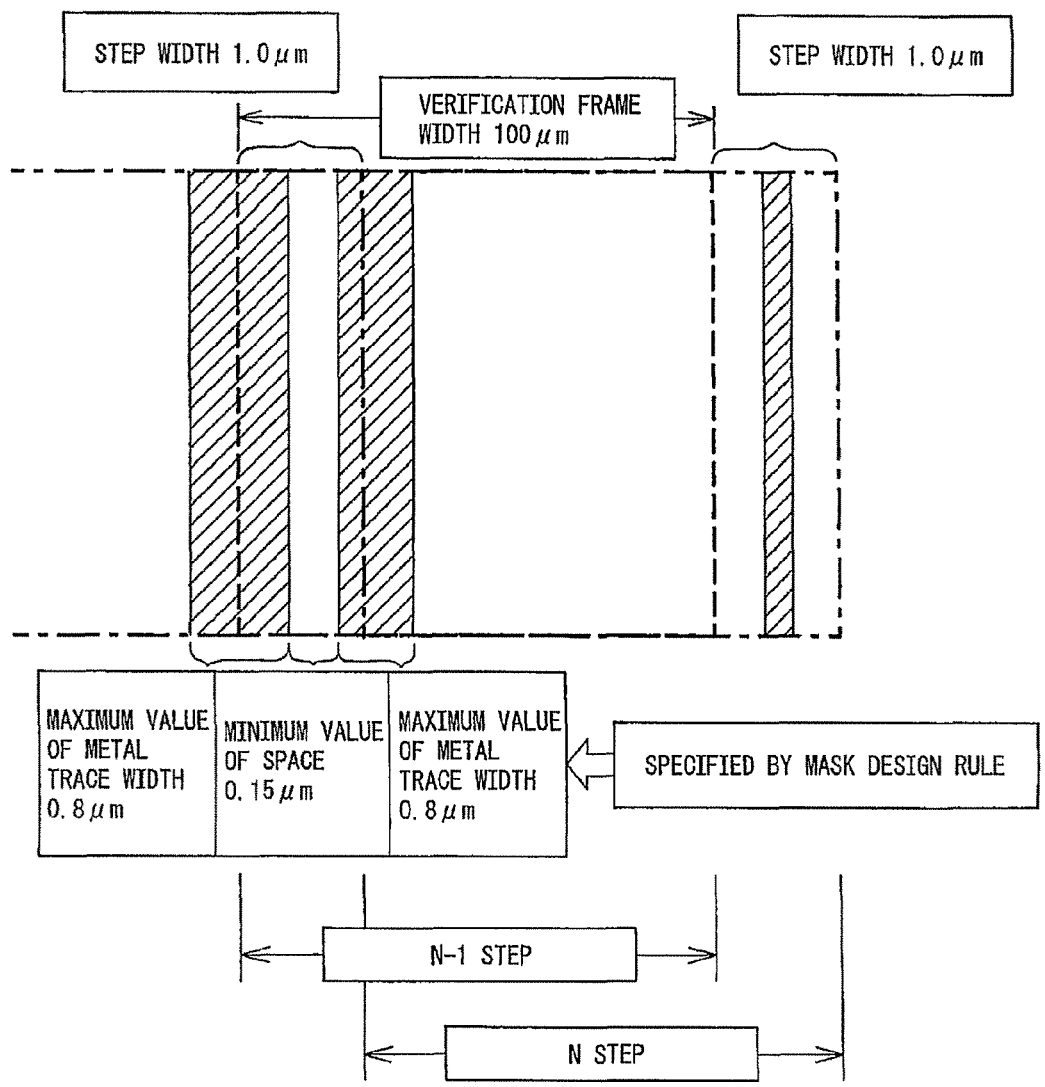
FIG. 7 is a diagram for describing the embodiments illustrated in FIGS. 5 and 6 in more detail.

FIG. 7 is a diagram for describing the embodiments illustrated in FIGS. 5 and 6 in more detail.

As illustrated in FIG. 7, for example, if an applicable mask design rule specifies that a maximum value of metal trace widths is 0.8 μm, a minimum value of gaps (spaces) is 0.15 μm, a width (a length of one side) of the verification frame is 100 μm, and a step width is 1.0 μm, then, a gap of at least 0.15 μm is included in the step width of 1.0 μm.

Thus, even if the virtual metal does not cover all of the step width 1.0 μm, a maximum percentage of the metal region in the step width specified by the design rule ((1.0 to 0.15)/1.0 =0.85: 85%) is determined. Therefore, it is sufficient that the virtual metal covers not all but only 85% of the step width.

As described above, when the density verification is performed in consideration of a maximum area that is covered by the virtual metal in a predetermined step width, a density error (a maximum density error) is prevented in the verification step and the verification frame based on an arbitrary origin.

Here, for example, when the step width is set to be smaller than the metal region, the virtual metal may cover all of the step width.

Figure 8:
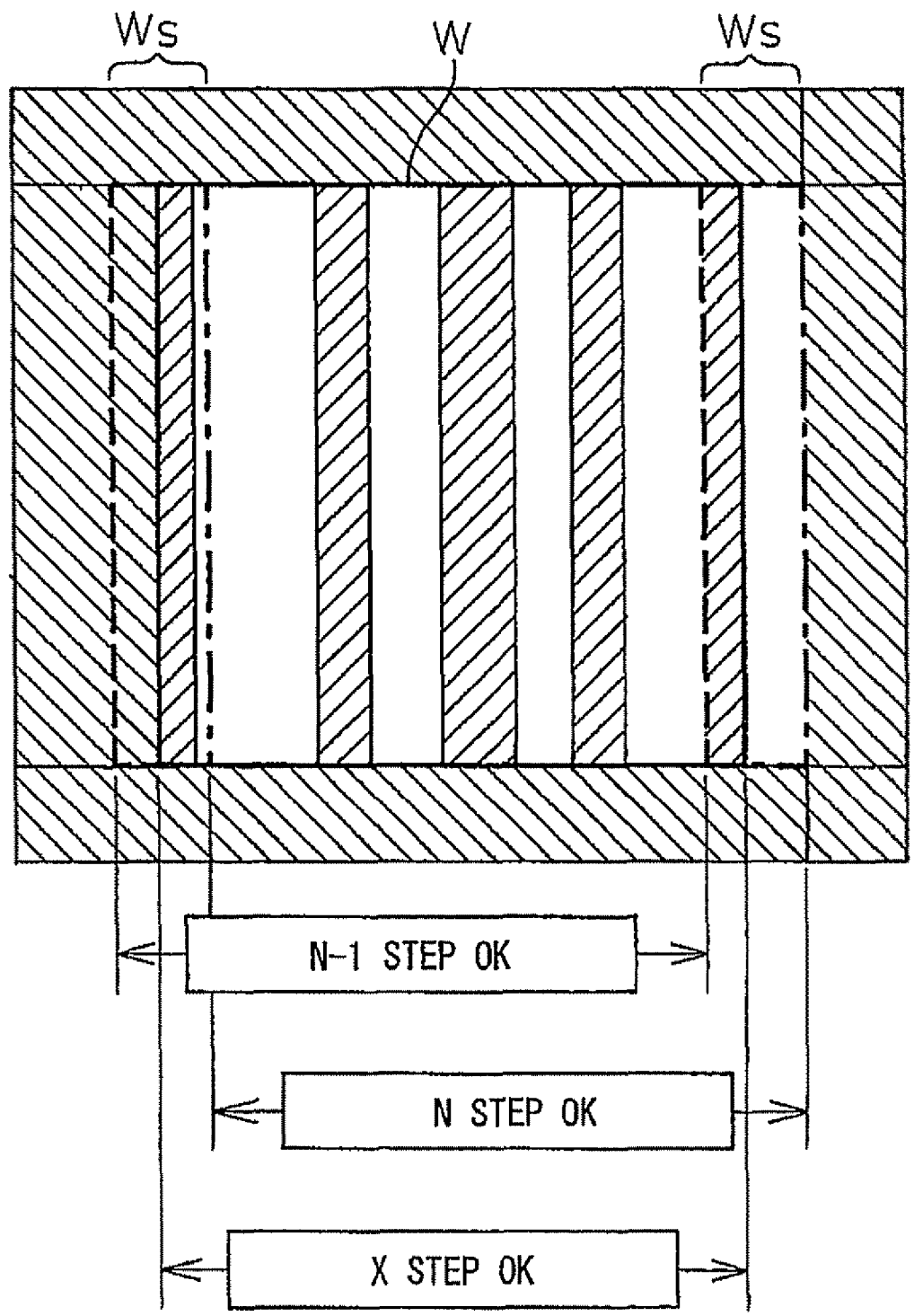
FIG. 8 is a diagram for describing the embodiment illustrated in FIG. 5 in more detail.

FIG. 8 is a diagram for describing the embodiment illustrated in FIG. 5 in more detail.

Figure 1:
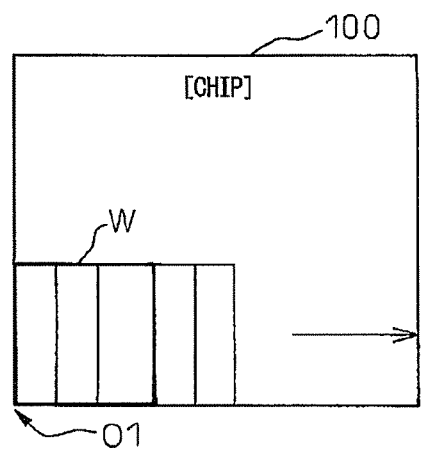
FIG. 1 is a diagram (part 1) for describing problems in a conventional method of designing a semiconductor device.
Figure 2:
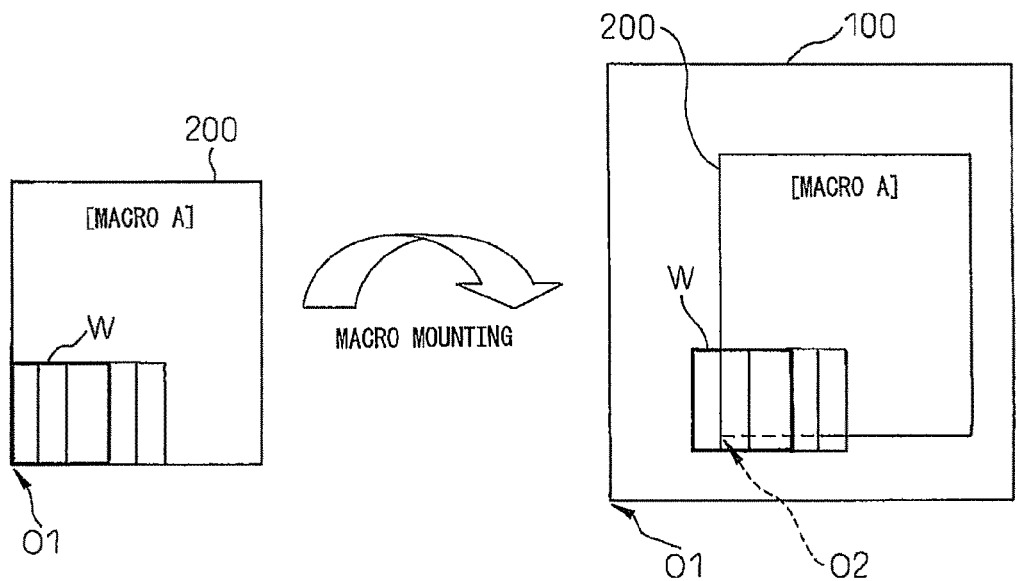
FIG. 2 is a diagram (part 2) for describing problems in a conventional method of designing a semiconductor device.
Figure 3:
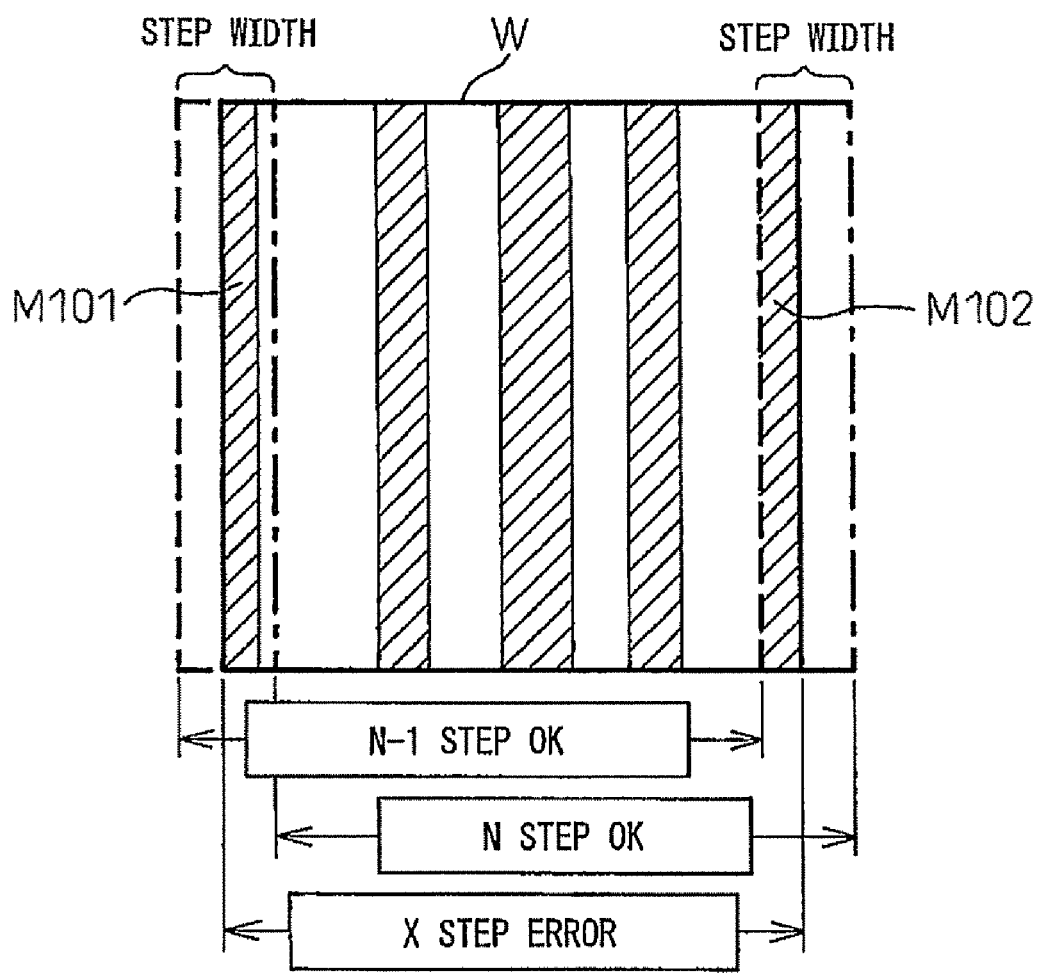
FIG. 3 is a diagram (part 3) for describing problems in a conventional method of designing a semiconductor device.
Figure 4:
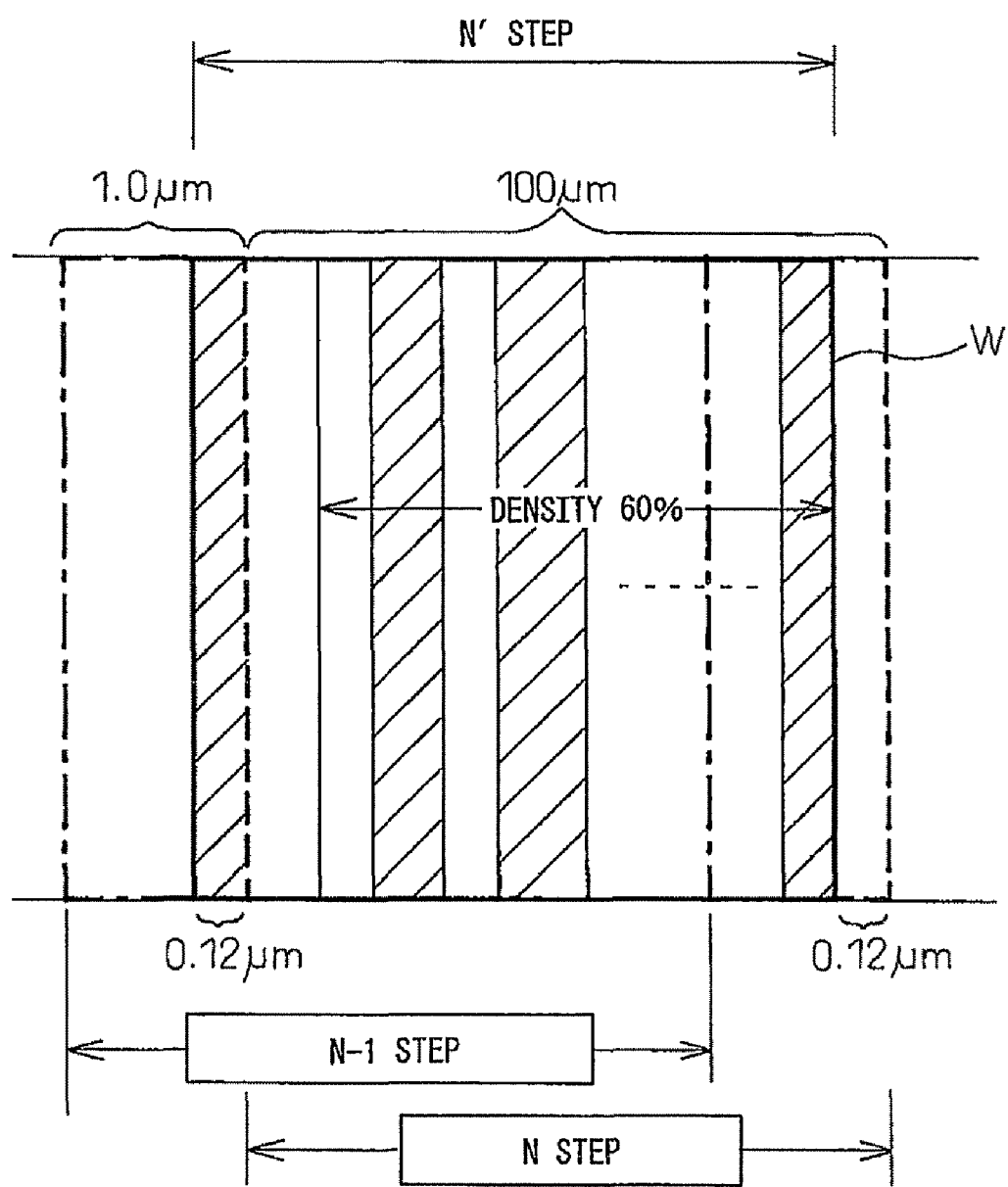
FIG. 4 is a diagram (part 4) for describing problems in a conventional method of designing a semiconductor device.

As obvious from comparison between the FIG. 8 and FIG. 3 described above, virtual patterns each including a predetermined step width are disposed outside four sides of verification frame W and the verification frame outside which the virtual patterns are disposed is moved sequentially by the predetermined step width, so as to perform the density verification of the layout data. As a result, occurrence of the density error will be prevented beforehand in the verification step and the verification frame based on an arbitrary origin.

Here, as described above with reference to FIG. 7, it is sufficient that each virtual metal pattern in the predetermined step width covers only a maximum area that may be included in the step width specified by an applicable design rule.

Figure 9:
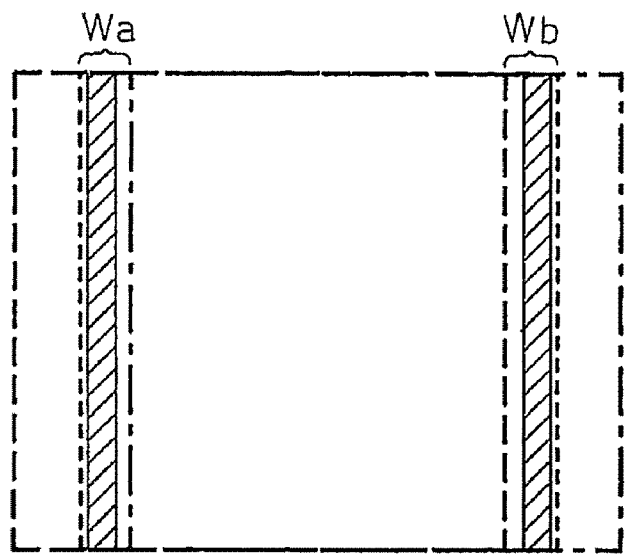
FIG. 9 is a diagram for describing the embodiment illustrated in FIG. 6 in more detail.

FIG. 9 is a diagram for describing the embodiment illustrated in FIG. 6 in more detail. In FIG. 9, step width Ws=Wa+Wb.

In FIG. 9, in the density verification of layout data, density variation due to change of trace patterns existing in a predetermined step width Ws (=Wa+Wb) may be detected in regular steps. Therefore, the density verification is performed taking into account a maximum area that may be covered by the virtual metal within predetermined step width Ws, so as to prevent the density error in an arbitrary verification frame.

Figure 10:
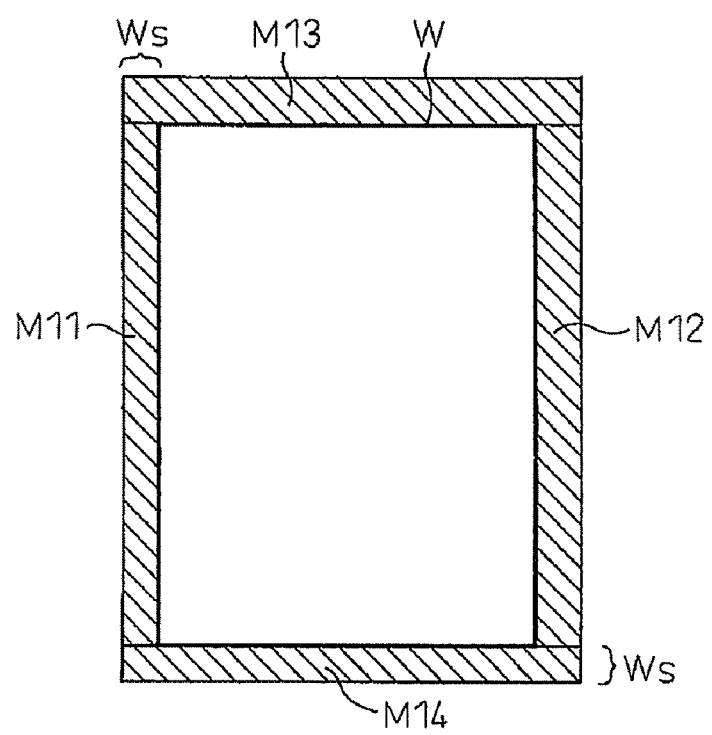
FIG. 10 is a diagram for schematically describing a variation of the embodiment illustrated in FIG. 5.

FIG. 10 is a diagram for schematically describing a variation of the embodiment illustrated in FIG. 5.

Although verification frame W includes a square shape in the embodiment illustrated in FIG. 5 (FIG. 8), this verification frame W may be a rectangular shape where adjacent sides include different lengths as illustrated in FIG. 10. Also when the density verification of the layout data is performed by using verification frame W of the rectangular shape, virtual patterns M11 to M14 each including a predetermined step width are disposed outside four sides of verification frame W and verification frame W outside which the virtual patterns are disposed is moved sequentially by the predetermined step width, so as to perform the density verification of the layout data. As a result, occurrence of the density error will be prevented in an arbitrary verification frame.

Figure 11:
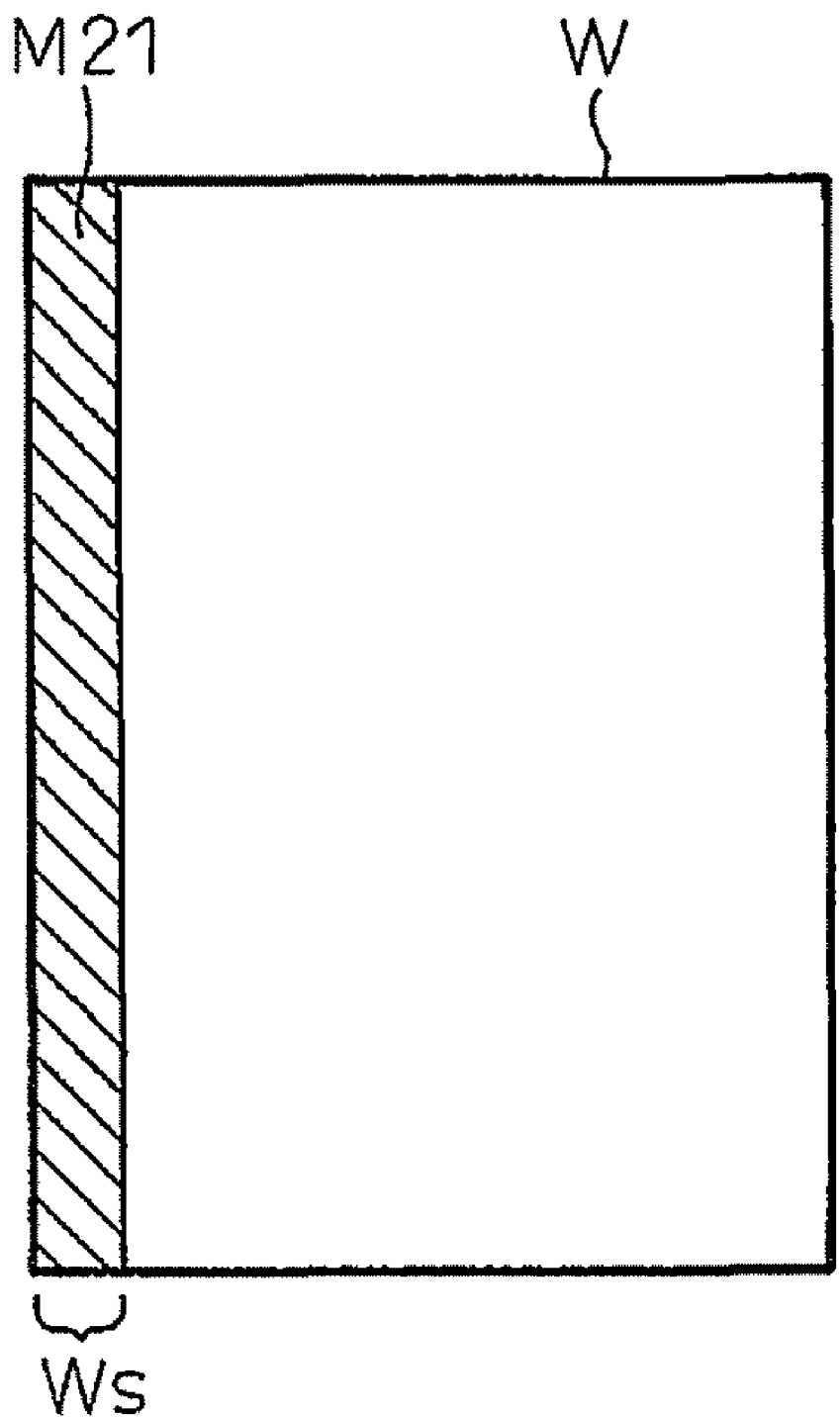
FIG. 11 is a diagram for schematically describing a variation of the embodiment illustrated in FIG. 6.

FIG. 11 is a diagram for schematically describing a variation of the embodiment illustrated in FIG. 6.

Although verification frame W includes a square shape in the embodiment illustrated in FIG. 6 (FIG. 9), this verification frame W may be a rectangular shape where adjacent sides include different lengths as illustrated in FIG. 11. Also when the density verification of the layout data is performed by using verification frame W of the rectangular shape, virtual pattern M21 including a predetermined step width is disposed inside one side of verification frame W and verification frame W inside which the virtual pattern is disposed is moved sequentially by the predetermined step width, so as to perform the density verification of the layout data. As a result, occurrence of the density error will be prevented in an arbitrary verification frame.

Here, in the variation of FIGS. 10 and 11, step width Ws of verification frame W may differ between vertical and horizontal directions. In this case, the virtual patterns including step widths corresponding to the vertical and horizontal directions are disposed outside the vertical and horizontal sides of verification frame W and verification frame W is moved sequentially by the step widths of the vertical and horizontal directions, respectively, so as to perform the density verification of the layout data.

Further, also when the density verification of the layout data is performed by using verification frame W of the rectangular shape as illustrated in FIGS. 10 and 11, as explained with reference to FIG. 7, as a matter of course, it is sufficient that each virtual metal pattern in the predetermined step width covers only a maximum areas that may be included in the step width specified by an applicable design rule.

Figure 12:
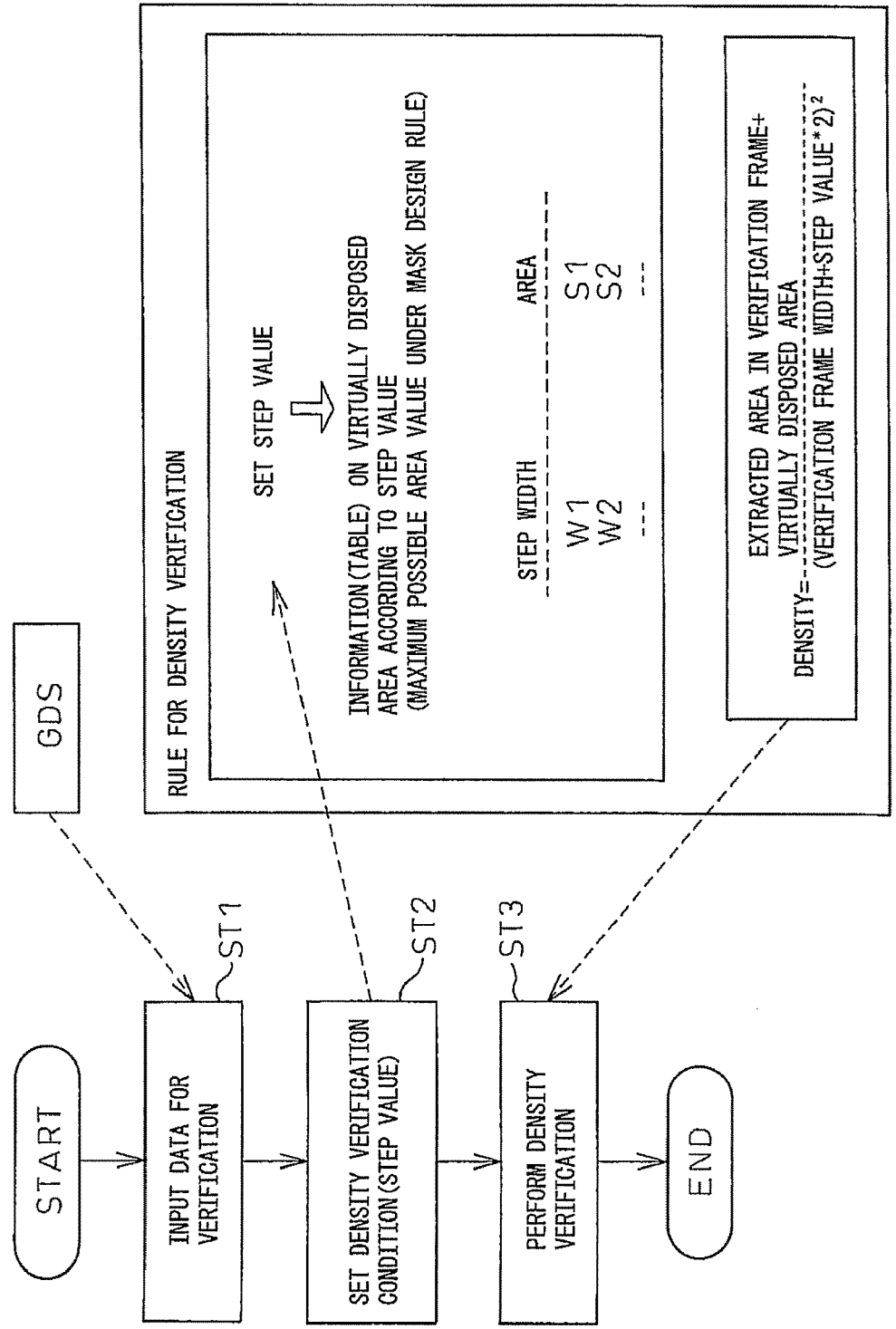
FIG. 12 is a flow chart for describing an example of a process of a layout data verification program for a semiconductor device according to the present embodiment.

FIG. 12 is a flow chart for describing an example of a process of a layout data verification program for a semiconductor device.

As illustrated in FIG. 12, when a layout data verification program for a semiconductor device is started, first, in step ST1, verification data is input from GDS (design data) and, then, proceeding to step ST2, a density verification condition (a step value) is set.

Thus, in step ST2, the step value is set and, according to the set step value and based on information (a table) on a virtually disposed area, a maximum possible area value under a mask design rule is determined. More specifically, for example, when the step value is W1, W2, . . . , the maximum possible area value under the mask design rule is S1, S2, . . . , respectively.

Then, proceeding to step ST3, density verification is performed. Here, as explained with reference to FIG. 5, assuming that an extracted area in a verification frame (an area of metal patterns extracted in verification frame W) is S0, a virtual disposition area (a total area of virtual metal patterns) is S1, a width of the verification frame is Wd, and a step width is Ws, then, density Dm1 of the metal pattern is expressed as follows:

$$Dm1=(S0+S1)/(Wd+2Ws)^2$$

Here, if the above density exceeds a specific standard value, trace layout is corrected.

Figure 13:
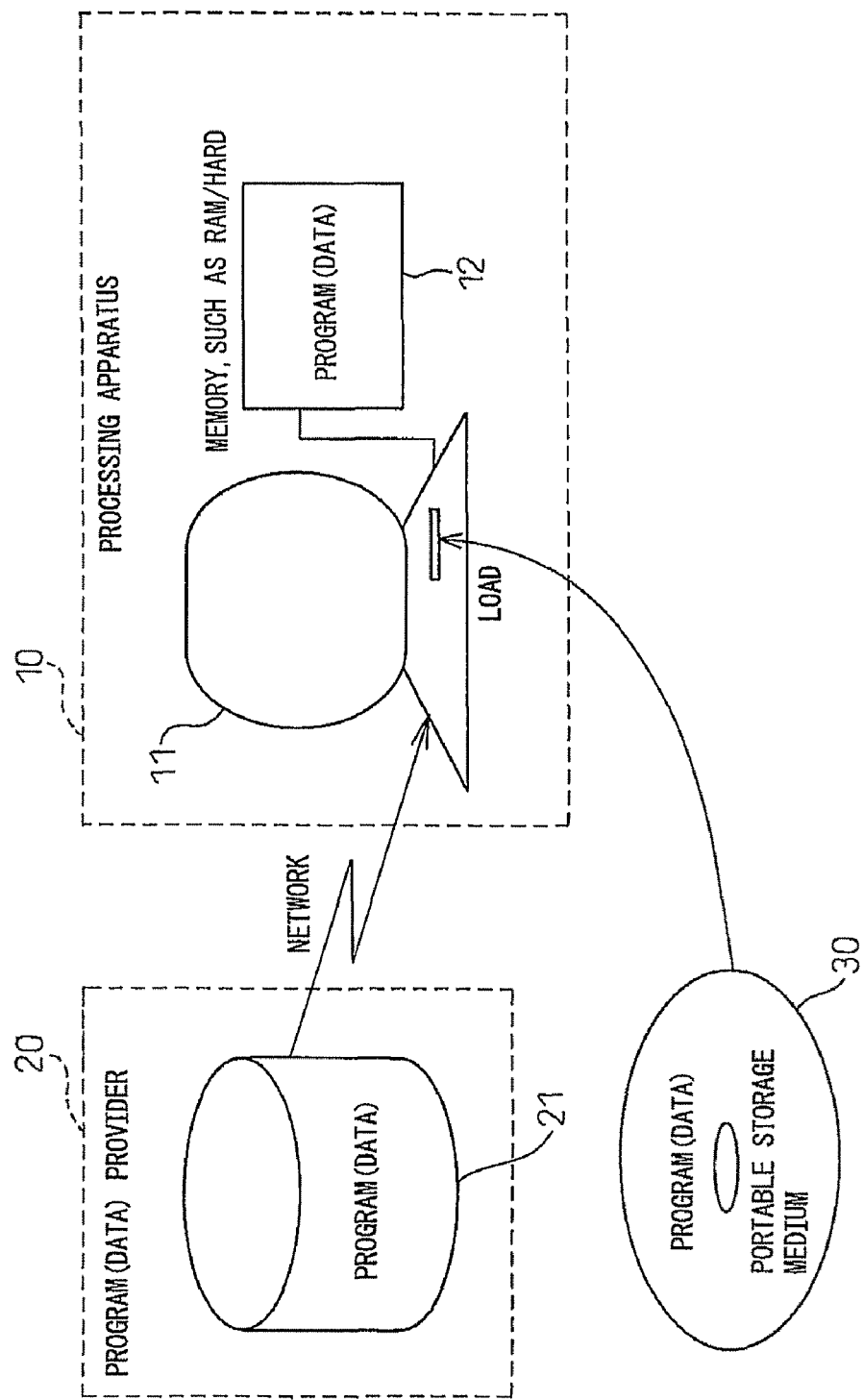
FIG. 13 is a diagram for describing an example of a medium storing a layout data verification program for a semiconductor device to which the present embodiment is applied.

FIG. 13 is a diagram for describing an example of a medium storing a layout data verification program for a semiconductor device to which the present embodiment is applied. In FIG. 13, reference symbol 10 denotes a processing apparatus, 20 denotes a program (data) provider, and 30 denotes a portable storage medium.

The present embodiment is given as a program (data) to processing apparatus 10, for example, as illustrated in FIG. 13, and performed by processing apparatus 10. Processing apparatus 10 includes: a main arithmetic processing unit 11 including a processor; and a processing apparatus memory (for example, a RAM (random access memory), a hard disk) 12 and so on that gives the program (data) to main arithmetic processing unit 11 or stores processed results. The program provided to processing apparatus 10 is loaded and performed on main memory of processing apparatus 10.

Program provider 20 includes means for storing the program (online memory: for example, a DASD (direct access storage device)) 21 and provides the program to processing apparatus 10 via a network such as the Internet and the like, for example, or via portable storage medium 30 such as optical disks (CD-ROM, DVD and the like), magnetic disks or magnetic tapes and the like. As a matter of course, the medium that stores the layout data verification program for the semiconductor device according to the present embodiment includes various media such as processing apparatus memory 12, online memory 21, portable storage medium 30 and the like.

As described above in detail, according to the present embodiment, the density standard will be satisfied for all starting origins at a macro level and, therefore, occurrence of a density error due to difference of the starting origins will be prevented at a chip level. The verification from one starting origin will be performed with accuracy similar to that of the verification from an infinite number of starting origins. Still further, even if the step width is changed, the density standard may not be changed according to the step width. Moreover, during the macro-level density verification, even if a minimum step value (a minimum design grid value) is not set, the density verification will be performed with high accuracy within a processable time period.

According to the embodiments, it is possible to provide a method of designing a semiconductor device and a layout data verification program including density verification of layout data in which the density verification is performed based on a corrected verification frame and, therefore, a density error (density exceeding a standard value) does not occur.

The above described embodiments may be applied to verify layout data of various semiconductor devices and, in particular, it is preferable as a method of designing the semiconductor devices and a computer readable medium that stores a layout data verification program in which density verification of the layout data is performed at a macro level.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present embodiment have been described in detail, it should be understood that the various changes, substitutions, and alterations could be made hereto without departing from the spirit and scope of the invention.

What is claimed is:

1. A method of designing a semiconductor device including density verification of layout data of the semiconductor device at a macro level, comprising:
    disposing virtual patterns each including a predetermined step width close to a circumference of a verification frame using a processing apparatus; and
    moving said verification frame outside which said virtual patterns are disposed sequentially by said predetermined step width and performing the density verification of the layout data of said semiconductor device.

2. The method of designing a semiconductor device as claimed in claim 1, wherein said virtual patterns are disposed along the circumference of said verification frame.

3. The method of designing a semiconductor device as claimed in claim 2, wherein said verification frame includes a rectangular shape.

4. The method of designing a semiconductor device as claimed in claim 3, wherein said virtual patterns are virtual metal patterns that are disposed outside respective ones of all four sides of said verification frame and each of which includes said predetermined step width.

5. The method of designing a semiconductor device as claimed in claim 3, wherein said virtual pattern is a virtual metal pattern that is disposed inside one side of said verification frame and that includes said predetermined step width.

6. The method of designing a semiconductor device as claimed in claim 2, wherein said verification frame includes a square shape.

7. The method of designing a semiconductor device as claimed in claim 6, wherein said virtual patterns are virtual metal patterns that are disposed outside respective ones of all four sides of said verification frame and each of which includes said predetermined step width.

8. The method of designing a semiconductor device as claimed in claim 6, wherein said virtual pattern is a virtual metal pattern that is disposed inside one side of said verification frame and that includes said predetermined step width.

9. The method of designing a semiconductor device as claimed in claim 1, wherein said verification frame includes a rectangular shape.

10. The method of designing a semiconductor device as claimed in claim 9, wherein said virtual patterns are virtual metal patterns that are disposed outside respective ones of all four sides of said verification frame and each of which includes said predetermined step width.

11. The method of designing a semiconductor device as claimed in claim 9, wherein said virtual pattern is a virtual metal pattern that is disposed inside one side of said verification frame and that includes said predetermined step width.

12. The method of designing a semiconductor device as claimed in claim 1, wherein said verification frame includes a square shape.

13. The method of designing a semiconductor device as claimed in claim 12, wherein said virtual patterns are virtual metal patterns that are disposed outside respective ones of all four sides of said verification frame and each of which includes said predetermined step width.

14. The method of designing a semiconductor device as claimed in claim 12, wherein said virtual pattern is a virtual metal pattern that is disposed inside one side of said verification frame and that includes said predetermined step width.

15. The method of designing a semiconductor device as claimed in claim 1, wherein when density of said layout data does not satisfy a predetermined standard, said virtual patterns are rearranged.

16. A computer readable storage non-transitory medium that stores a layout data verification program of a semiconductor device for making a computer to execute:
    disposing virtual patterns each including a predetermined step width on a circumference of a verification frame; and
    moving said verification frame outside which said virtual patterns are disposed sequentially by said predetermined step width and performing the density verification of the layout data of said semiconductor device.

* * * * *